(12) United States Patent
Kim et al.

(10) Patent No.: US 6,214,735 B1
(45) Date of Patent: Apr. 10, 2001

(54) METHOD FOR PLANARIZING A SEMICONDUCTOR SUBSTRATE

(75) Inventors: Chang-gyu Kim, Kyunggi-do; Ji-hyun Choi, Seoul; Seok-ji Hong, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/080,874

(22) Filed: May 18, 1998

(30) Foreign Application Priority Data

May 17, 1997 (KR) ................................. 97-19115

(51) Int. Cl.[7] ................. H01L 21/311; H01L 21/4763; H01L 21/302; H01L 21/461
(52) U.S. Cl. .................. 438/703; 438/631; 438/697; 438/435; 438/704
(58) Field of Search ....................... 438/624, 633, 438/634, 632, 631, 424, 434, 437, 697–699, 704, 726–732, 703

(56) References Cited

U.S. PATENT DOCUMENTS

| | | | |
|---|---|---|---|
| 4,396,460 | * 8/1983 | Tamaki | 156/653 |
| 4,732,761 | * 3/1988 | Machida | 437/228 |
| 4,876,217 | * 10/1989 | Zdebel | 437/67 |
| 4,946,550 | * 8/1990 | Van Laarhoven | 156/643 |
| 5,266,525 | * 11/1993 | Morozumi | 437/195 |
| 5,286,518 | * 2/1994 | Cain | 427/96 |
| 5,378,309 | * 1/1995 | Rabinzohn | 156/643 |
| 5,641,712 | * 6/1997 | Grivna | 438/624 |
| 5,837,618 | * 11/1998 | Avanzino | 438/778 |
| 5,872,052 | * 2/1999 | Iyer | 438/622 |
| 5,872,064 | * 2/1999 | Huff | 438/778 |
| 5,920,792 | * 7/1999 | Lin | 38/633 |
| 5,946,592 | * 8/1999 | Lin | 438/633 |
| 5,958,795 | * 9/1999 | Chen | 38/692 |

* cited by examiner

Primary Examiner—Chares Bowers
Assistant Examiner—Erik Kielin
(74) Attorney, Agent, or Firm—Marger Johnson & McCollom, P.C.

(57) ABSTRACT

A method for planarizing a semiconductor substrate uses a difference in etch selectivity of insulators on the semiconductor substrate. The method comprises the steps of wet-etching the second and first insulating layers at upper edges of the elevated region until portions of the first insulating layer are exposed at the upper edges, forming a third insulating layer on the first and second insulating layers, and wet-etching the third and second insulating layers until an upper surface of the first insulating layer is exposed. During the wet-etching, the second insulating layer is etched faster than the third insulating layer. With this method, the semiconductor substrate has an even surface.

11 Claims, 6 Drawing Sheets

METHOD FOR PLANARIZING A SEMICONDUCTOR SUBSTRATE

FIELD OF THE INVENTION

The present invention relates generally to a method for planarizing a semiconductor substrate, and more particularly to a method for planarizing an interlayer insulating film on a semiconductor substrate using a difference in etch selectivity of insulators.

BACKGROUND OF THE INVENTION

With the gradual increase in integration of semiconductor devices, much effort has been dedicated to planarization processes to planarize an insulating layer, such as an interlayer insulating layer formed on a semiconductor substrate. Recently, STI process known as (Shallow Trench Isolation) has been widely used to electrically isolate device elements on a semiconductor substrate on the behalf of LOCOS process, and increase in step between the device elements requires a variety of planarization techniques.

There have been several processes used to planarize insulating layers, for example, BPSG (Boron Phosphorus Silicate Glass) reflow, SOG (Spin On Glass) or photoresist etch back, and CMP (Chemical Mechanical Polishing). Particularly, CMP can be used to planarize a wider area in comparison with the other processes, and can be performed at a low temperature. Because of these advantages, CMP has come into wide use in substrate planarization. A typical CMP process is disclosed in, for example, U.S. Pat. No. 5,064,683, issued Feb. 27, 1996.

However, substrate planarization using CMP leads to three main problems: first, in a substrate structure having dish-shape, a dishing phenomenon is generated. Second, the substrate is contaminated by a polishing slurry. Third, the substrate and the CMP planarizing apparatus are contaminated by particles generated during the CMP process.

SUMMARY OF THE INVENTION

The present invention is intended to solve the problems encountered in CMP, and it is an object of the invention to provide a method for planarizing a semiconductor substrate using a difference in etch selectivity of insulators.

According to one aspect of the present invention, there is provided a method for planarizing a semiconductor substrate having an uneven topography including an elevated region and a recessed region adjacent to each other. After sequentially forming first and second insulating layers on the semiconductor substrate, a sputter-etching process is performed to remove the second and first insulating layers at upper edges of the elevated region until portions of the first insulating layer are exposed at the upper edges. Next, a third insulating layer is formed on the first and second insulating layers and then a wetetching process is performed to remove the third and second insulating layers until an upper surface of the first insulating layer is exposed. During the wet-etching process, since the second insulating layer has a relatively high etch selectivity relative to the first or third insulating layer, the second insulating layer is etched faster than the third insulating layer. The semiconductor substrate may have an even surface.

According to another aspect of the present invention, there is provided a method for planarizing a semiconductor substrate having an uneven topography including an elevated region and an adjacent recessed region. First, second and third insulating layers are sequentially formed on the elevated and recessed regions by either HDP CVD or ECR CVD. The second and third insulating layers are wet-etched to expose an upper surface of the first insulating layer. The second insulating layer is deposited and at the same time etched during formation thereof to etch upper edges of the elevated region faster than the other portions, and thereby the third insulating layer is formed on the second insulating layer including the first insulating layer exposed at the upper edges of the elevated region.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

The present invention will be described with reference to preferred embodiments, but it must be recognized that the present invention can be widely modified and varied, and the scope of the present invention is not limited except as set forth in the accompanying claims.

FIGS. 1A through 1F show a method for planarizing a semiconductor substrate according to a first embodiment of the present invention.

Figure 1A:
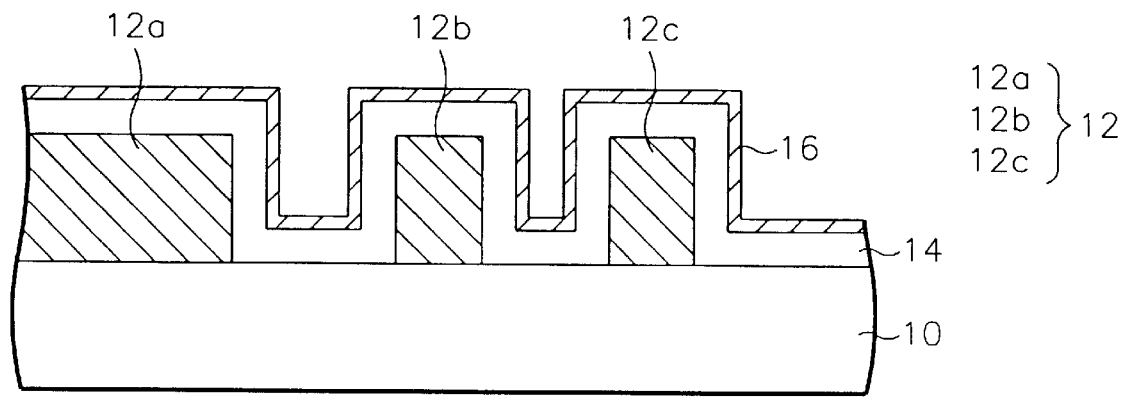
FIGS. 1A through 1F are flow diagrams showing the process steps of a method for planarizing a semiconductor substrate according to a first embodiment of the present invention.

Referring to FIG. 1A, on a semiconductor substrate 10, a pattern 12 of, for example, a plurality of metal interconnections 12a, 12b, and 12c is formed. In the embodiment shown in FIG. 1A, the metal interconnections have sizes different from one another. Thus, the semiconductor substrate 10 has an uneven topography including elevated regions (e.g., metal interconnections) adjacent to recessed regions. Herein, the elevated region may be made of intermetal dielectric instead of the metal interconnection, and the recessed region may be the semiconductor substrate 10. A first insulating layer 14 is formed over the semiconductor substrate 10 and interconnections 12a, 12b, and 12c. A second insulating layer 16 is then formed over insulating layer 14. The second insulating layer 16 is preferably formed of SiOF, PSG (Phosphorus Silicate Glass), BN (Boron Nitride), or BPSG (Boron Phosphorus Silicate Glass), and has a relatively high etch selectivity relative to the first insulating layer 14.

Figure 1B:
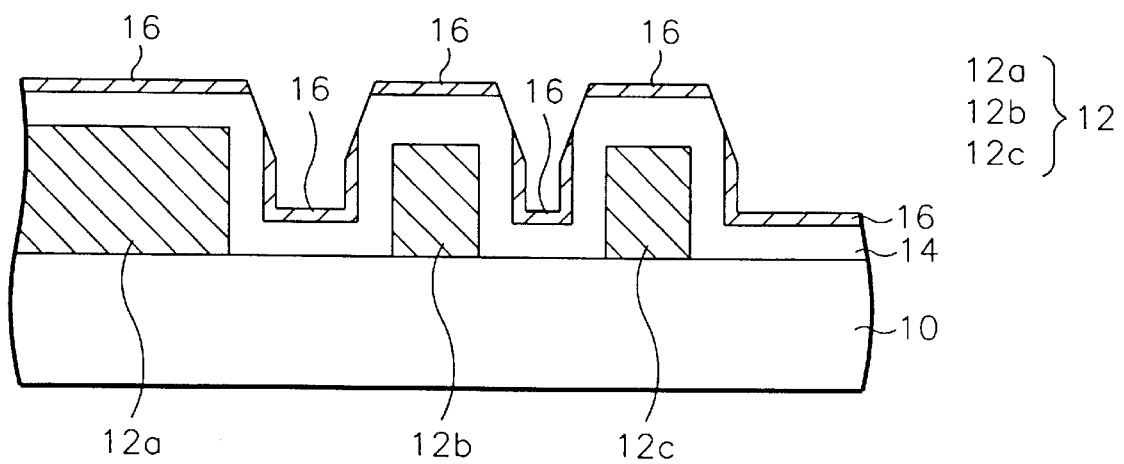

Referring now to FIG. 1B, a sputter etching process using argon (Ar) gas is performed until whole portions of upper edges of the second insulating layer 16 and first insulating layer 14 is exposed at 17.

Figure 1C:
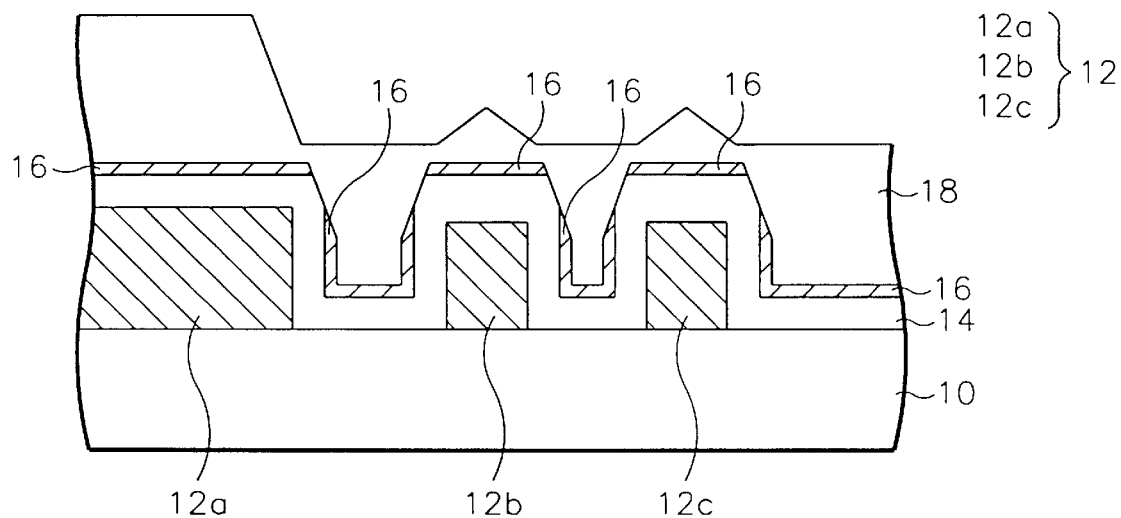

With reference to FIG. 1C, a third insulating layer 18 of oxide is formed over the substrate by a CVD (Chemical Vapor Deposition) process such as HDP (High Density Plasma) CVD process, or ECR (Electron Cyclotron Resonance) CVD process. The third insulating layer 18 has a low etch selectivity to the second insulating layer 16. During the HDP CVD or ECR CVD process, deposition and etching are simultaneously performed. For this reason, on the metal interconnection 12a, which is relatively large, CVD layer 18a is formed which has a high step and large size. CVD layers 18b and 18b, each which has lower step and smaller size, are formed on the metal interconnections 12b and 12c.

Figure 1D:
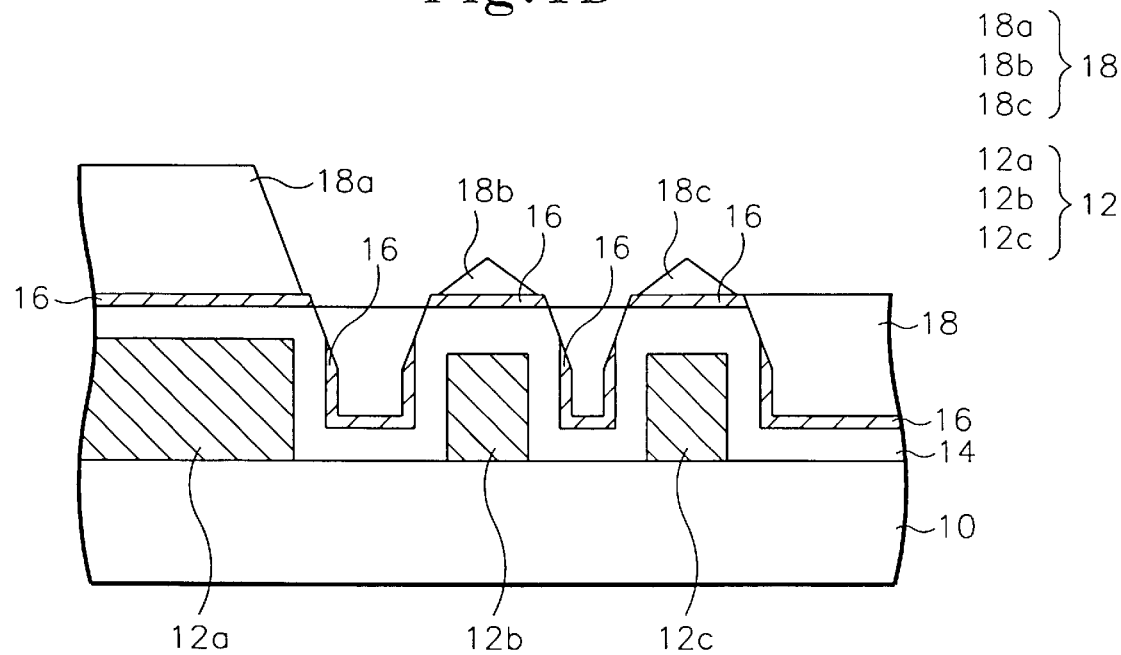
Figure 1E:
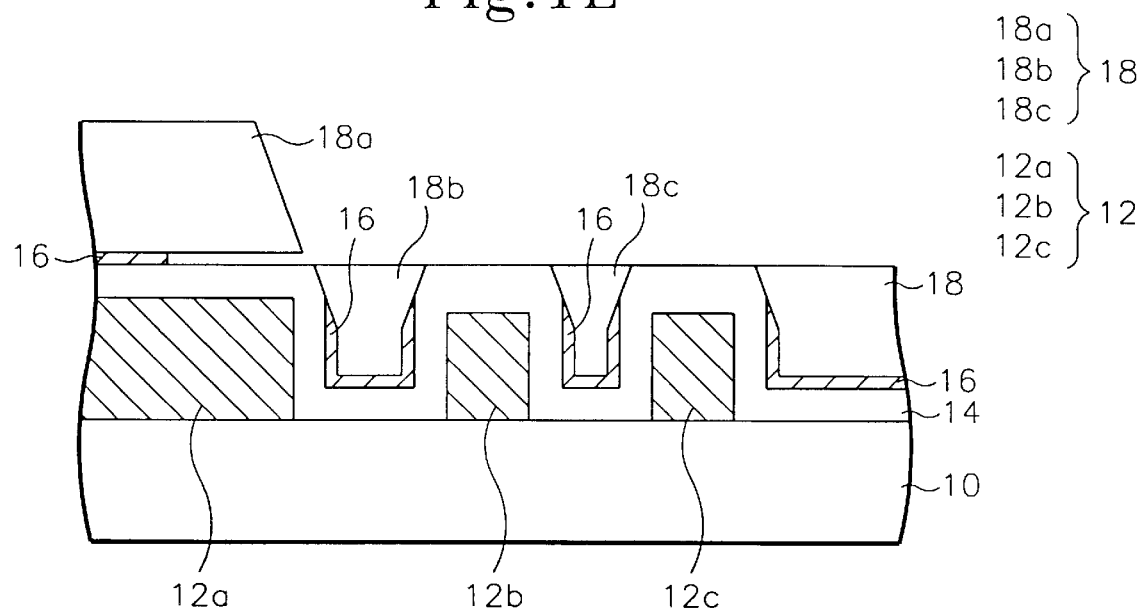
Figure 1F:
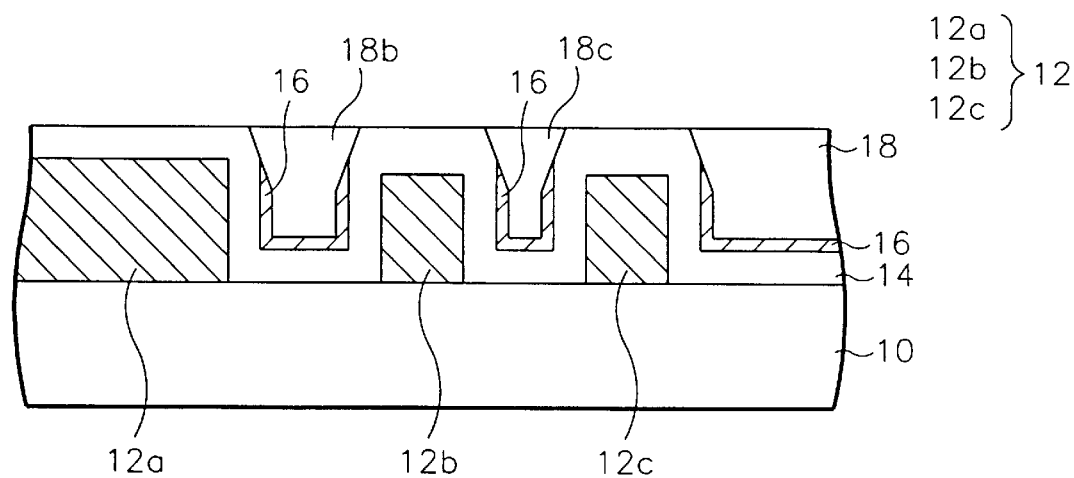

FIGS. 1D to 1F show a wet etching step for planarizing the insulating layers. First, referring to FIG. 1D, a wet etching of the third insulating layer 18 continues to be performed until both ends of the second insulating layer 16 at the elevated region are exposed.

Subsequently, as shown in FIGS. 1E and 1F, if the wet etching continued, the exposed second insulating layer 16 is etched faster than the third insulating layer 18, and thereby the semiconductor substrate may have an even surface. However thin the third insulating layer 18 formed above the metal interconnection 12a is, the second insulating layer 16 is removed very fast as compared to the third insulating layer. This is because the second insulating layer 16 has a relatively high etch selectivity relative to the first and third insulating layers 14 and 18. Also, since the second insulating layer 16 has a relatively thin thickness as compared to the first or third insulating layer, it can be removed far faster, as is apparent from FIG. 1E.

On the other hand, since the second and third insulating layers formed above the metal interconnections 12b and 12c are far narrower in width than those formed above the metal interconnection 12a, they can be completely removed while those formed above the metal interconnection 12a are partially etched, although not shown.

Also, as can be seen immediately above, even though the third insulating layer 18 formed above the metal interconnection 12a is not completely removed, the semiconductor substrate may have a desired even surface as shown in FIG. 1F. This is because the second insulating layer 16 can be completely removed prior to complete removal of the third insulating layer 18.

Hereinafter, a method for planarizing a semiconductor substrate according to a second embodiment of the present invention will be described with reference to FIGS. 2A through 2E.

Figure 2A:
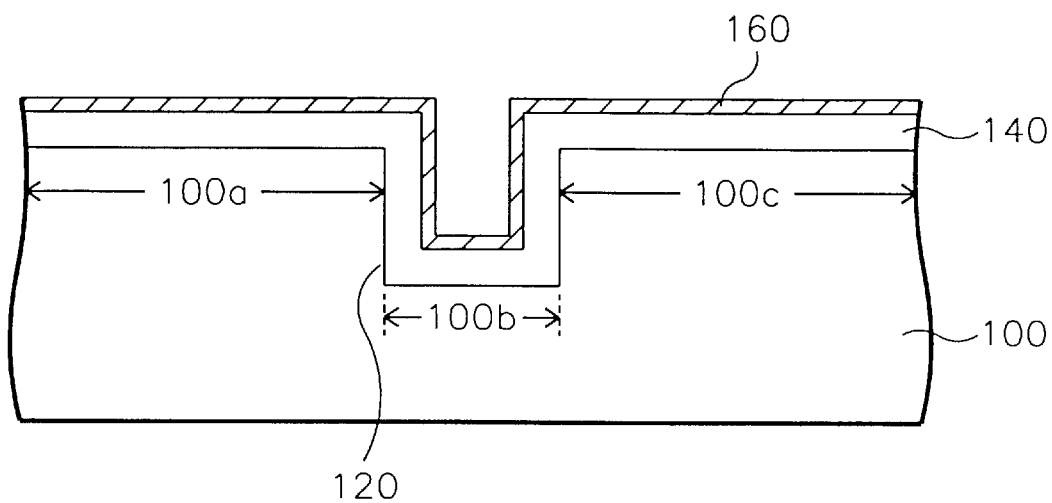
FIGS. 2A through 2E are flow diagrams showing the process steps of a method for planarizing a semiconductor substrate according to a second embodiment of the present invention.

Referring to FIG. 2A, a semiconductor substrate 10 has had a trench 120 etched to define device isolation regions (in this case trench isolation region) where an insulating material is to be infilled. After formation of the trench 120, a first insulating layer 140 is formed on both sidewalls and bottom of the trench 120 and on the semiconductor substrate 100. A second insulating layer 160 is then formed over the first insulating layer 140. Thus, the semiconductor substrate 100 has an uneven topography including an elevated region (e.g., the semiconductor substrate regions 100a and 100c) adjacent to a recessed region (e.g., the trench) 100b. As in the first embodiment, the second insulating layer 160 in this embodiment is preferably made of SiOF, PSG, BN, or BPSG, and has a relatively high etch selectivity relative to the first insulating layer 140.

Figure 2B:
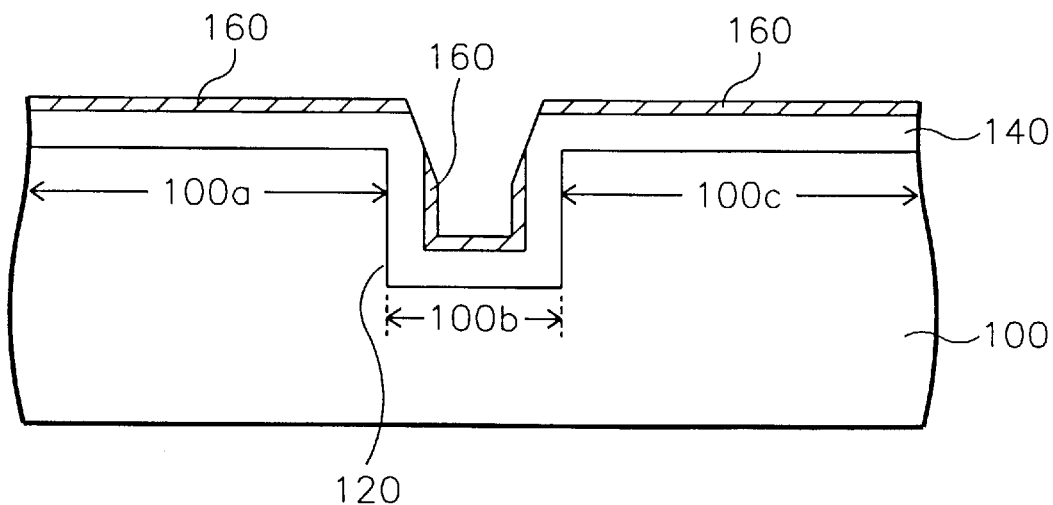

Referring to FIG. 2B, a sputtering process using argon (Ar) gas is performed to remove portions of the second insulating layer 160 and parts of upper edges of the first insulating layer 140 are removed.

Figure 2C:
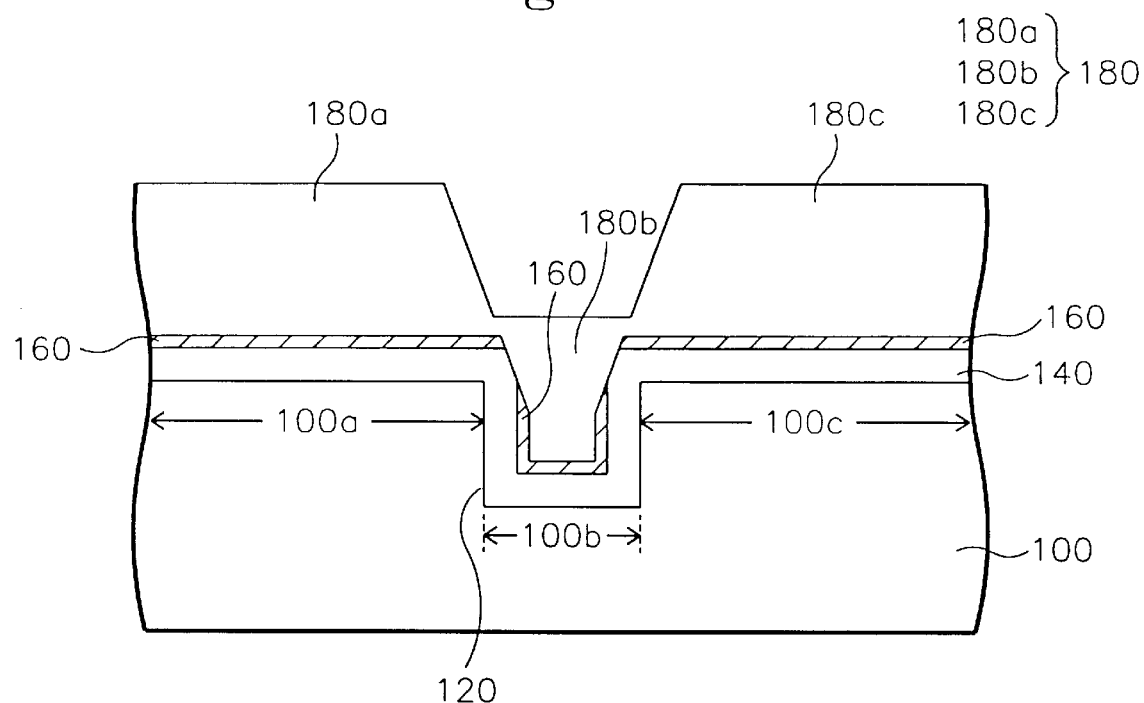

With reference to FIG. 2C, a third insulating layer 180 of oxide is formed over the substrate by a CVD process such as HDP CVD or ECR CVD. The third insulating layer 180 has a respectively low etch selectivity relative to the second insulating layer 160. During the formation of insulating layer 180, on the elevated regions 100a and 100b, portions 180a and 180c are formed. On the recessed region 100b, for example, in the trench 120 is formed CVD layer 180b which has low step and small size.

Figure 2D:
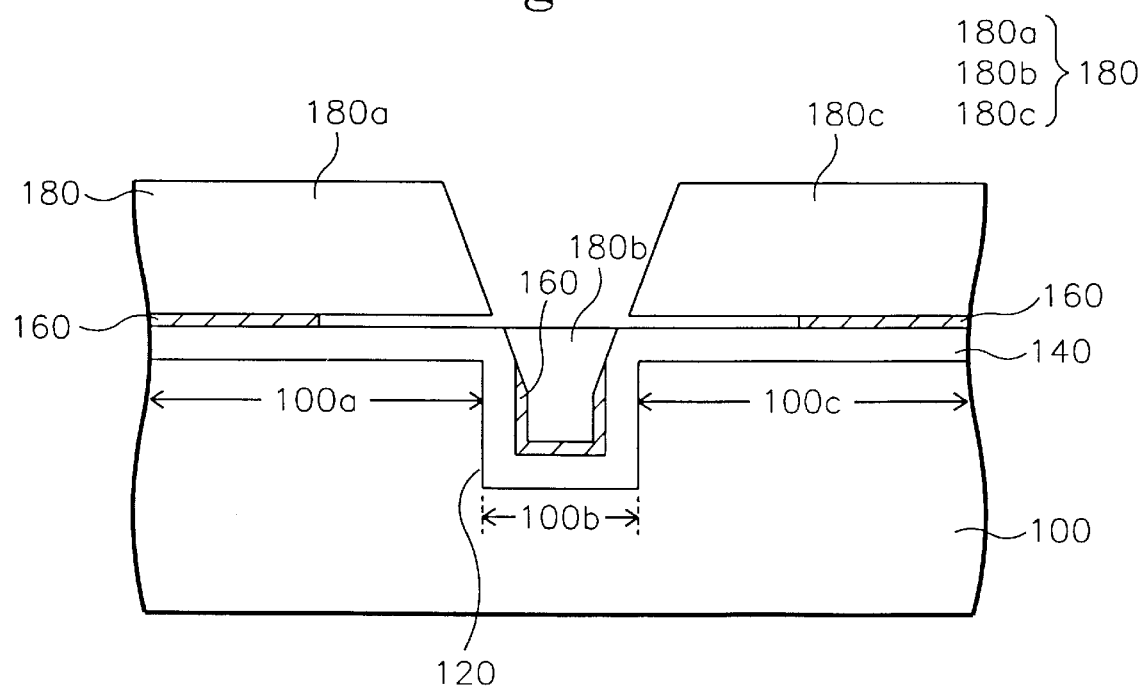
Figure 2E:
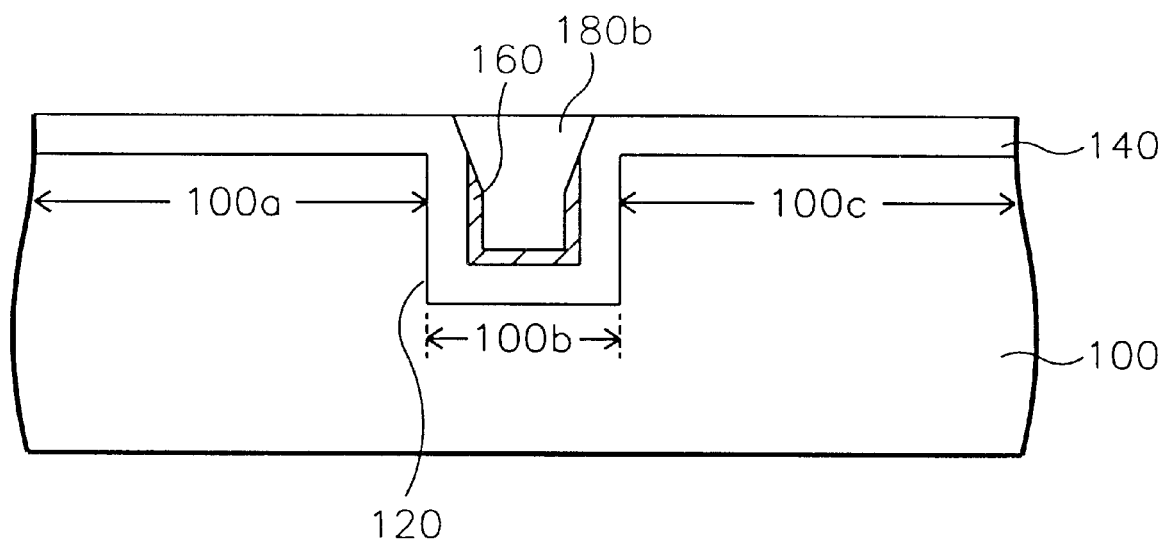

Referring to FIGS. 2D and 2E, a wet etching step for planarizing the insulating layers is performed. First, as shown in FIG. 2D, the wet etching of the third insulating layer 180 continues to be performed until ends of the second insulating layer 160 at the elevated regions are exposed. If the wet etching is continued, the exposed second insulating layer 160 is etched faster than the third insulating layer 180, thereby the semiconductor substrate may have an even surface, as shown in FIG. 2E.

During the wet etching of the third and second insulating layers, however thin the third insulating layer 180 formed above the elevated regions 100a is, the second insulating layer 160 may be removed very fast as compared to the third insulating layer. This is because the second insulating layer 160 has a high etch selectivity relative to the first and third insulating layers 140 and 180, and because the second insulating layer 160 has a thin thickness relative to the first or third insulating layer.

Also, even though the third insulating layer 180 formed above the elevated regions 100a and 100c is not completely removed, the semiconductor substrate may have a desired even surface, as shown in FIG. 2E, because the second insulating layer 160 can be completely removed prior to complete removal of the third insulating layer 18.

On the other hand, if all of the above-described first, second, and third insulating layers are formed on the semiconductor substrate, which has the metal interconnection pattern 12 or the trench 120 thereon, by HDP CVD process or ECR CVD process, they can be formed without use of the argon sputtering process. This is because the insulating layers can be deposited and at the same time etched. Particularly, since upper edges of the pattern or the trench are etched with the most high etch selectivity, an discontinuous insulating layer, for example, an elevated and recessed insulating layer can be formed on the semiconductor substrate. In this case, the second insulating layer is made of material having a relatively high etch selectivity to the first and third insulating layers. The material is selected from a group which consists of SiOF, PSG, BN, and BPSG. The third insulating layer is made of one selected from a group consisting of HDP CVD oxide and ECR CVD oxide.

Thus, the present invention provides the advantage of a semiconductor substrate, which can have an even surface by wet etching without generation of a dishing phenomenon and contamination of slurry and particles.

What is claimed is:

1. A method for planarizing a semiconductor substrate, comprising the steps of:

preparing a semiconductor substrate having an uneven topography including an elevated region and an adjacent recessed region;

sequentially forming first and second insulating layers on the elevated and recessed regions;

etching the second and first insulating layers at upper edges of the elevated region until portions of the first insulating layer are exposed at the upper edges;

forming a third insulating layer on the first and second insulating layers, said second insulating layer having a relatively high etch selectivity relative to the first or third insulating layer; and wet-etching the third and second insulating layers until an upper surface of the first insulating layer is exposed.

2. The method as defined in claim 1, wherein said second and first insulating layers at upper edges of the elevated region are sputter etched by Ar sputter etching.

3. The method as defined in claim 1, wherein said second insulating layer is made of one selected from a group consisting of SiOF, PSG, BN, and BPSG.

4. The method as defined in claim 1, wherein said third insulating layer is made of one selected from a group consisting of HDP CVD oxide and ECR CVD oxide.

5. The method as defined in claim 1, wherein said elevated region comprises an intermetal dielectric pattern region and the recessed region comprises the semiconductor substrate.

6. The method as defined in claim 1, wherein said elevated region comprises the semiconductor substrate and the recessed region comprises a trench region.

7. A method for planarizing a semiconductor substrate, comprising the steps of:

preparing a semiconductor substrate having an uneven topography including an elevated region and a recessed region adjacent to each other;

sequentially forming first, second and third insulating layers on the elevated and recessed regions by either HDP CVD process or ECR CVD process, said second insulating layer having a high etch selectivity relative to the first or third insulating layer; and wet-etching the third and second insulating layers until an upper surface of the first insulating layer are exposed to form a planarized semiconductor substrate, wherein the second insulating layer is deposited and at the same time etched during formation thereof to remove upper edges of the elevated region faster than the other portions, thereby exposing portions of the first insulating layer, and the third insulating layer is formed on the second insulating layer and the portions of the first insulating layer exposed at the upper edges of the elevated region.

8. The method as defined in claim 7, wherein said second insulating layer is made of one selected from a group consisting of SiOF, PSG, BN, and BPSG.

9. The method as defined in claim 7, wherein said third insulating layer is made of one selected from a group consisting of HDP CVD oxide and ECR CVD oxide.

10. The method as defined in claim 7, wherein said elevated region comprises an intermetal dielectric pattern region and the recessed region comprises the semiconductor substrate.

11. The method as defined in claim 7, wherein said elevated region comprises the semiconductor substrate and the recessed region comprises a trench region.

* * * * *

UNITED STATES PATENT AND TRADEMARK OFFICE
CERTIFICATE OF CORRECTION

PATENT NO.     : 6,214,735 B1                                      Page 1 of 1
DATED          : April 10, 2001
INVENTOR(S)    : Kim et al.

It is certified that error appears in the above-identified patent and that said Letters Patent is hereby corrected as shown below:

Column 5,
Line 2, "of one selected" should read -- of a material selected --.

Signed and Sealed this

Fourth Day of February, 2003

JAMES E. ROGAN
*Director of the United States Patent and Trademark Office*